METHOD OF FABRICATING A SEMICONDUCTOR BY OUT-DIFFUSION
Filed July 9, 1963
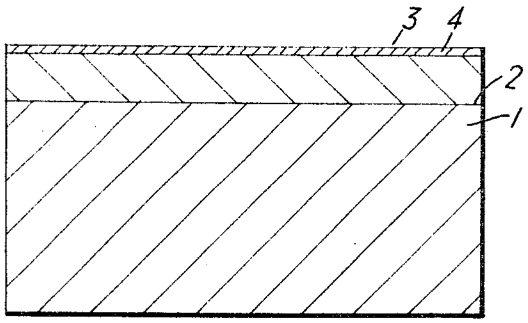
Inventors
CYRIL F. DRAKE
KENNETH L. ELLINGTON
By
Attorney

3,320,103
METHOD OF FABRICATING A SEMICONDUCTOR BY OUT-DIFFUSION

Cyril Francis Drake and Kenneth Leopold Ellington, London, England, assignors to International Standard Electric Corporation, New York, N.Y., a corporation of Delaware Filed July 9, 1963, Ser. No. 293,604
Claims priority, application Great Britain, Aug. 3, 1962, 29,958/62
13 Claims. (Cl. 148—191)

This invention relates to the manufacture of p-n junction semiconductor devices.

It is well known that most semiconductor p-n junctions, when biased in the reverse direction, pass a current that is larger than the theoretical minimum for an ideal junction. The theoretical reverse current is to be understood as meaning the current consequent on the thermal generation of carriers from centers located in the space charge region, and approximately a diffusion length beyond the limit of the space charge region. It is either independent of voltage, or increases with voltage as a fractional power of the voltage. The excess current may exceed by many orders of magnitude the theoretical minimum, and can lead to the premature breakdown of the device before the design limit for the reverse voltage is reached. The design limit is to be understood to mean that voltage at which avalanche multiplication produces a current voltage relationship defined by $dI/dv=\alpha$.

In the production of p-n junction devices the semiconductor is normally heated for many minutes at temperatures in the range 600–1300° C. Within this temperature range the diffusion rate of many impurities is so high that impurities that enter at the surface of the semiconductor will become distributed throughout the bulk of the specimen. For example, in the production of diffused silicon p-n junctions, temperature and times of the order of 1200° C. and 10 hours respectively are common. The diffusion constant in silicon of many non-significant impurities, that is to say elements other than those of Groups III and V of the Periodic Table, for example Cu, Ag, Au, Fe, Ni, is sufficiently large ($\sim 10^{-5}$ cm.$^2$ sec.$^{-1}$) under these conditions for the aforesaid bulk-redistribution to occur. The impurities may enter the specimen from many sources; they may be initially present on the surface, they may enter from the atmosphere in which the diffusion is conducted, or they may come from the furnace walls or from the heating elements. When the specimen is subsequently cooled, the impurities in many cases remain distributed throughout the specimen. It is believed that their presence, in the vicinity of a p-n junction, is responsible for the excess current observed in many junction devices.

An object of the invention is to reduce the magnitude of the excess reverse current.

According to the invention there is provided a method of manufacturing a semiconductor device having at least one p-n junction by producing a disturbed arrangement of atoms in the crystal lattice of the semiconductor material in a confined region not coincident with the region in which the p-n junction is present or is to be formed, heating the device to a temperature at which the diffusion length of fast-diffusing non-significant impurities becomes comparable with the distance of the p-n junction region from the disturbed region, and cooling the device at a controlled rate, the disturbed region being produced before the cooling (or before the heating).

It is believed that this effects the removal of the aforesaid impurities from the vicinity of the p-n junction and to concentrate them in the "disturbed" region, but it is to be understood that the invention is in no way limited by the validity of this explanation of its mode of operation.

An embodiment of the invention will now be described with reference to the accompanying drawing, which shows a sectioned view of a p-n junction semiconductor device.

A polished slice 1 of n-type silicon, 0.010 inch thick, is gallium diffused to produce a p-n junction 2 0.002 inch below the face 3. The slice is then lightly abraded on the face 3 with 600-grade alumina abrasive in water on a glass plate to produce a disturbed arrangement of atoms in the crystal lattice of the semiconductor material in a confined region 4 not coincident with the region of the p-n junction 2. The depth of the deformed region 4 is of the order of 0.0002 inch. After washing with deionised water, the slice is heated in a suitable furnace to 1100° C. in oxygen. This causes the slice to be raised to a temperature above that at which the diffusion constant, D, of fast-diffusing non-significant impurities, already referred to, becomes sufficiently large for the value of the diffusion length L, $=\sqrt{Dt}$, where $t$ is of the order of 100 seconds to become comparable with the distance of the p-n junction 2 from the disturbed region 4.

The slice is then cooled at a controlled rate, not exceeding about 100° C. per minute, and in this example, the cooling is at a rate 20° C. per minute. The cooling rate is varied according to the semiconductor material used.

The reverse current is reduced from 15 ma./cm.$^2$ at 120 v. before the treatment to 20$\mu$a./cm.$^2$ at 500 v. after the treatment.

Ohmic electrode connection may conveniently be made to the surface of the disturbed region 4 as the roughening of the surface by the mechanical abrasion provides a key for solder used in making the connection.

The following reference contains a detailed analysis and description of diffusion processes in semiconductors useful in connection with the practice of applicants' invention: H. Reiss and C. S. Fuller, "Diffusion Processes in Germanium and Silicon," chapter 6 of "Semiconductors," edited by N. B. Hannay, Reinhold Publishing Corp., New York, 1959.

The invention is not limited by the details of the method described above. The device, of any semiconductor material, may contain one or more p-n junctions, which may be produced, for example, by diffusion, during crystal-growth, or by epitaxial means. The damaged or disturbed region of the semiconductor may be confined to one part of the surface of the specimen, and may be produced by any convenient means known.

The damaged or disturbed region could alternatively be on a surface other than the surface 3, for instance on the lower surface of the slice of n-type silicon 1. In this latter instance, however, the temperature will have to be adjusted accordingly due to the increased distance of the p-n junction 2 from the disturbed region.

For example, the damaged or disturbed region may be produced by heating and rapidly cooling a localised region of the surface by sweeping a high energy beam of particles or electromagnetic radiation across the region in question. The damaged or disturbed layer may be produced at any convenient stage in the production of the device.

What we claim is:

1. A process for treating a monocrystalline semiconductor body having first and second regions of given and opposite respective conductivity types with a p-n junction therebetween, at least a portion of said junction being disposed at a predetermined depth from a given surface of said body, at least one of said regions containing a conductivity-type-determining impurity material, said body containing at least one non-significant impurity material the presence of which in either of said regions has no substantial effect on the conductivity type thereof, the diffusion constant of said non-significant impurity material in said semiconductor body at a given temperature being substantially greater than the diffusion constant of said conductivity-type-determining impurity material in said semiconductor body at said temperature, comprising the steps of:

forming a disturbed region within said body having a relatively high concentration of lattice defects at a predetermined distance from said p-n junction portion; and heating said semiconductor body to said given temperature for a given time such that the distribution of said at least one non-significant impurity within said body is substantially modified while the distribution of said at least one conductivity-type determining impurity within said body remains relatively unaffected.

2. A process according to claim 1, comprising the additional step of cooling said heated semiconductor body to room temperature at a sufficiently slow rate such that relatively few lattice defects are generated in the undisturbed portion of said body during said cooling step.

3. A process according to claim 1, comprising the additional step of cooling said heated body to room temperature at a rate not exceeding 100° centigrade per minute.

4. A process according to claim 1, wherein said given time is approximately equal to the ratio of the square of said predetermined distance to said non-significant impurity diffusion constant.

5. A process according to claim 1, wherein each of said first and second regions contains a corresponding conductivity-type-determining impurity material, each of said corresponding materials having a diffusion constant in said semicodnuctor body substantially less than said non-significant impurity diffusion constant.

6. A process according to claim 5, wherein said disturbed region is contiguous with said given surface.

7. A process according to claim 1, wherein substantially the entire area of said p-n junction is disposed at said predetermined depth.

8. A process according to claim 1, wherein said semiconductor body comprises a substance selected from the group consisting of germanium and silicon.

9. A process according to claim 8, wherein said at least one non-significant impurity material comprises a substance containing elements other than those belonging in Groups III and V of the Periodic Table.

10. A process according to claim 8, wherein said at least one non-significant impurity material comprises an element selected from the group consisting of copper, silver, gold, iron and nickel.

11. A process according to claim 5, wherein said semiconductor body comprises silicon, said given temperature is approximately 1100° centigrade, and said given time is approximately 100 seconds.

12. A process according to claim 11, wherein one of said corresponding conductivity-type-determining impurity materials is gallium.

13. A process according to claim 11, comprising the additional step of cooling said heated body to room temperature at a rate of approximately 20° centigrade per minute.

References Cited by the Examiner

UNITED STATES PATENTS

| | | | |
|---|---|---|---|
| 2,691,736 | 10/1954 | Haynes | 148—1.5 X |
| 2,784,121 | 3/1957 | Fuller | 148—191 X |
| 2,868,988 | 1/1959 | Miller | 148—1.5 |
| 2,978,367 | 4/1961 | Kestenbaum | 148—186 X |
| 3,076,732 | 2/1963 | Tanenbaum | 148—1.5 |
| 3,082,127 | 3/1963 | Lee | 148—190 X |
| 3,174,882 | 3/1965 | Logan | 148—1.5 |
| 3,193,419 | 7/1965 | White | 148—191 |
| 3,200,017 | 8/1965 | Pell | 148—190 |
| 3,206,336 | 9/1965 | Hora | 148—1.5 X |
| 3,212,939 | 10/1965 | Davis | 148—1.5 |

HYLAND BIZOT, *Primary Examiner.*